(12) United States Patent
Mukerji et al.

(10) Patent No.: US 6,300,679 B1
(45) Date of Patent: *Oct. 9, 2001

(54) FLEXIBLE SUBSTRATE FOR PACKAGING A SEMICONDUCTOR COMPONENT

(75) Inventors: Prosanto K. Mukerji, Phoenix; Ronald E. Thomas, Tempe; George W. Hawkins, Gilbert; Rajesh Srinivasan, Scottsdale; Colin B. Bosch, Phoenix; James H. Knapp, Chandler; Laura J. Norton, Apache Junction; Michael J. Seddon, Gilbert, all of AZ (US)

(73) Assignee: Semiconductor Components Industries, LLC, Phoenix, AZ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/087,674

(22) Filed: Jun. 1, 1998

(51) Int. Cl.$^7$ .......................... H01L 23/50; H01L 23/02; H01L 23/48; H05K 1/18
(52) U.S. Cl. .......................... 257/738; 257/737; 257/700; 257/701; 257/758; 257/723; 257/686; 257/693; 257/692; 257/696; 257/698; 361/735; 361/749; 361/783; 361/776
(58) Field of Search .......................... 257/738, 730, 257/723, 686, 685, 787, 646, 676, 727, 728, 737, 700, 692, 701, 693, 758, 696, 698; 365/735, 749, 776, 783

(56) References Cited

U.S. PATENT DOCUMENTS

| | | | |
|---|---|---|---|
| 4,721,995 | * 1/1988 | Tanizawa | 257/777 |
| 4,783,594 | * 11/1988 | Schulte et al. | 250/370.08 |
| 5,072,283 | 12/1991 | Bolger. | |
| 5,220,198 | 6/1993 | Tsuji | 257/731 |
| 5,285,107 | * 2/1994 | Kazami et al. | 257/723 |
| 5,332,921 | * 7/1994 | Dousen et al. | 257/723 |
| 5,347,159 | 9/1994 | Khandros et al. | 257/692 |
| 5,363,275 | 11/1994 | Frankeny et al. | . |
| 5,382,829 | 1/1995 | Inoue | 257/668 |
| 5,397,916 | * 3/1995 | Normington | 257/723 |
| 5,408,172 | * 4/1995 | Chen | 257/730 |
| 5,448,511 | 9/1995 | Paurus et al. | 257/686 |
| 5,534,727 | * 7/1996 | Inoue | 257/668 |
| 5,567,657 | 10/1996 | Wojnarowski et al. | 437/214 |
| 5,646,446 | * 7/1997 | Nicewarner, Jr. et al. | 257/723 |
| 5,659,198 | * 8/1997 | Okutomo et al. | 257/659 |
| 5,661,086 | * 8/1997 | Nakashima et al. | 257/668 |
| 5,684,677 | * 11/1997 | Uchida et al. | 361/770 |
| 5,708,297 | * 1/1998 | Clayton | 257/723 |
| 5,763,939 | * 6/1998 | Yamashita | 257/668 |
| 5,767,570 | * 6/1998 | Rostoker | 257/668 |
| 5,776,797 | * 7/1998 | Nicewarner, Jr. et al. | 438/107 |
| 5,789,815 | * 8/1998 | Tessier et al. | 257/723 |
| 5,805,422 | * 9/1998 | Otake et al. | 361/749 |
| 5,831,627 | * 11/1998 | Cohen | 345/431 |
| 5,886,876 | * 3/1999 | Yamaguchi | 361/767 |
| 5,925,930 | * 7/1999 | Farnworth et al. | 257/737 |
| 5,980,270 | * 11/1999 | Fjelstad et al. | 439/71 |
| 6,002,168 | * 12/1999 | Bellaar et al. | 257/696 |
| 6,002,590 | * 12/1999 | Farnworth et al. | 361/749 |
| 6,014,316 | * 1/2000 | Eide | 361/735 |

OTHER PUBLICATIONS

R. Tummala et al., "Microelectronics Packaging Handbook", 1989, pp. 409–435.
Nitto Denko, "Tape Center Application for Chip Scale Package", ASMAT Conference, Feb. 1998.

\* cited by examiner

*Primary Examiner*—Alexander O. Williams
(74) *Attorney, Agent, or Firm*—Robert D. Atkins; Michael T. Wallace

(57) ABSTRACT

A semiconductor component includes a semiconductor chip (341, 502, 601, 701, 1101, 1410, 1501) having first and second surfaces opposite each other, a semiconductor device (301) in the semiconductor chip (341, 502, 601, 701, 1101, 1410, 1501), and a flexible substrate (120, 401, 510, 610, 710, 1000, 1050, 1300, 1401, 1510, 1520) packaging the semiconductor chip (341, 502, 601, 701, 1101, 1410, 1501).

30 Claims, 5 Drawing Sheets

FLEXIBLE SUBSTRATE FOR PACKAGING A SEMICONDUCTOR COMPONENT

BACKGROUND OF THE INVENTION

This invention relates, in general, to electronics, and more particularly, to semiconductor components and methods of manufacture.

After semiconductor devices are formed in a semiconductor wafer and after the wafer is singulated into individual semiconductor substrates or dice, the dice are assembled into packaged components. A conventional assembly process includes, among other steps, mounting the die onto metal leadframes, wire bonding or tape automated bonding the die to the leadframes, and then using a high pressure transfer or injection molding compound to encapsulate or package the die, wire bonds, and leadframes. However, conventional assembly processes are expensive, complicated, and time consuming. Additionally, the conventional assembly processes produce costly leadframe scrap and encapsulant scrap. Furthermore, the conventional packaged components have poor thermal dissipation and reliability.

Accordingly, a need exists for a less complicated and lower cost method of manufacturing semiconductor components that reduces scrap, that reduces the size and weight of the package, and that improves thermal dissipation and reliability.

BRIEF DESCRIPTION OF THE DRAWINGS

For simplicity and clarity of illustration, the elements in the drawings are not necessarily drawn to scale, and the same reference numerals in different figures denote the same elements.

DETAILED DESCRIPTION OF THE DRAWINGS

Figure 1:
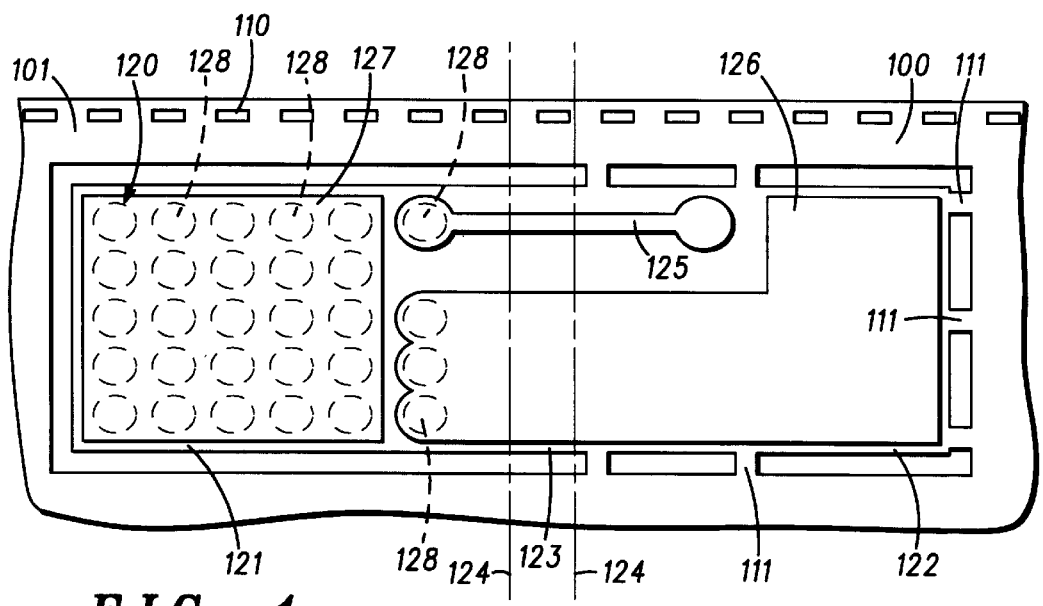
FIG. 1 illustrates a top view of an embodiment of a flexible circuit layer or packaging substrate in accordance with the present invention.

FIG. 1 illustrates a top view of an embodiment of a flexible circuit layer or packaging substrate 120. Substrate 120 is used to package a semiconductor chip. As a package material, substrate 120 protects the semiconductor chip from moisture, corrosion, contamination, physical impact, or the like. Substrate 120 also serves as an electrical interconnect for the semiconductor chip. As an interconnect structure or circuit layer, substrate 120 electrically couples the semiconductor chip to other electronic components located outside of substrate 120.

Substrate 120 includes an electrically insulative substrate that has a middle portion 123 located between dashed lines 124. Middle portion 123 couples together opposite ends 121 and 122 of the electrically insulative substrate. As explained hereinafter, substrate 120 is folded around a semiconductor chip by bending substrate 120 along lines 124 such that end 121 overlies end 122. Accordingly, the portions of substrate 120 along dashed lines 124 should be flexible. In the preferred embodiment, the electrically insulative substrate is comprised of a flexible material such as, for example, polyimide or polyester.

Substrate 120 also includes a layer of electrically conductive material or traces 125, 126, and 127. Traces 125 and 126 are located over middle portion 123 and ends 121 and 122. Trace 127 is located over end 121. In the preferred embodiment, traces 125, 126, and 127 are electrically isolated from each other to provide proper electrical operation of a semiconductor component. The portions of traces 125 and 126 located over dashed lines 124 should be flexible or malleable for reasons explained earlier. In the preferred embodiment, traces 125, 126, and 127 are comprised of copper, gold, aluminum, nickel, solder, or the like.

Substrate 120 further includes vias 128 at end 121 of the electrically insulative substrate. Vias 128 are represented by dashed circles in FIG. 1 because vias 128 are located underneath traces 125, 126, and 127. In the preferred embodiment, traces 125, 126, and 127 completely cover all of vias 128. Vias 128 preferably extend completely through the electrically insulative substrate of substrate 120 to electrically couple a semiconductor chip to an external component, as explained in more detailed hereinafter.

Substrate 120 can be part of a ribbon or tape 100. Surface 101 of tape 100 is illustrated in FIG. 1. Tape 100 can have a plurality of substrates 120 along the length and width of tape 100. Tabs 111 physically couple substrate 120 to tape 100. In the preferred embodiment, tabs 111 are only connected to end 122 and are not connected to end 121 or middle portion 123 in order to facilitate the bending of substrate 120 along dashed lines 124, as explained in more detail hereinafter.

In the preferred embodiment, tape 100 is dispensed from a reel or other suitable dispenser and has guide holes 110 at its edges for gears or other devices to move tape 100 from one processing station to the next. In this embodiment, tape 100 serves as a conveyor belt transporting semiconductor components from one processing station or step to the next during assembly, packaging, and electrical testing. Furthermore, in this embodiment, the semiconductor components preferably remain mounted on tape 100 between each of the assembling, packaging, and electrical testing steps.

At one processing station, a semiconductor substrate or chip is mounted over surface 101 of tape 100. In particular, the chip can be mounted on end 122 of substrate 120 such that traces 125 and 126 are electrically coupled to a semiconductor device in the chip Alternatively, the chip can be mounted over end 121 of substrate 120, but chip is preferably mounted on end 122 of substrate 120 because of fiduciary marks on end 122. If the chip is mounted over end 121, then tabs 111 should be coupled to end 121, not end 122, of substrate 120.

Solder can be used to electrically couple the chip to traces 125 and 126. The solder can be applied to the chip before the chip is mounted onto substrate 120, or the solder can be applied directly to the traces of substrate 120 before the chip is mounted onto substrate 120. The results of this mounting step are explained in more detail hereinafter.

Then, substrate 120 is bent or folded along dashed lines 124 such that end 121 overlies the chip and end 122 of substrate 120. This bending step also mounts end 122 to the semiconductor chip and electrically couples trace 127 to the semiconductor device in the chip, as explained in more detail hereinafter. Substrate 120 can be bent along dashed lines 124 before or after the chip is mounted onto substrate 120. The malleability of traces 125 and 126 help to keep substrate 120 in the bent configuration. If substrate 120 is bent after the chip is mounted and if substrate 120 is comprised of a polyimide, then substrate 120 is preferably less than approximately fifty micrometers thick. However, if substrate 120 is bent before the chip is mounted and if substrate 120 is comprised of a polyimide, then substrate 120 is preferably less than approximately seventy-five micrometers thick. In the embodiment where substrate 120 is pre-bent, substrate 120 can be bent prior to being unrolled from the reel or tape dispenser. In this pre-bent embodiment, a vacuum or other mechanical tool can be used to at least partially unbend substrate 120 in order to permit the mounting of the semiconductor chip to end 122 of substrate 120.

Figure 2:
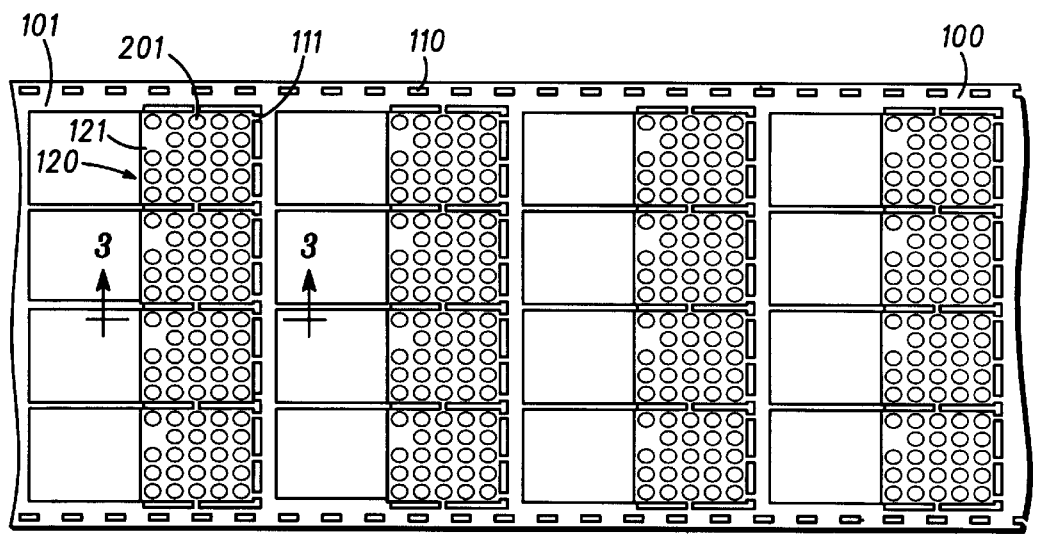
FIG. 2 illustrates a top view of an embodiment of a plurality of the packaging substrates after subsequent manufacturing steps in accordance with the present invention.

FIG. 2 illustrates a top view of a plurality of substrates 120 after the semiconductor chip is mounted to substrates 120 and after end 121 is folded over end 122 (FIG. 1) of substrates 120. Vias 128 (FIG. 1) are filled with electrical interconnect structures 201, which are electrically coupled to traces 125, 126, and 127 (FIG. 1) located on surface 101 (FIG. 1) of substrate 120. As an example, structures 201 can be formed from plated solder bumps, dispensed solder paste, solder balls, flip chip bumps, or the like. After the formation of structures 201 and while substrates 120 remain connected or attached to tape 100, the electronic components can be electrically tested.

Figure 3:
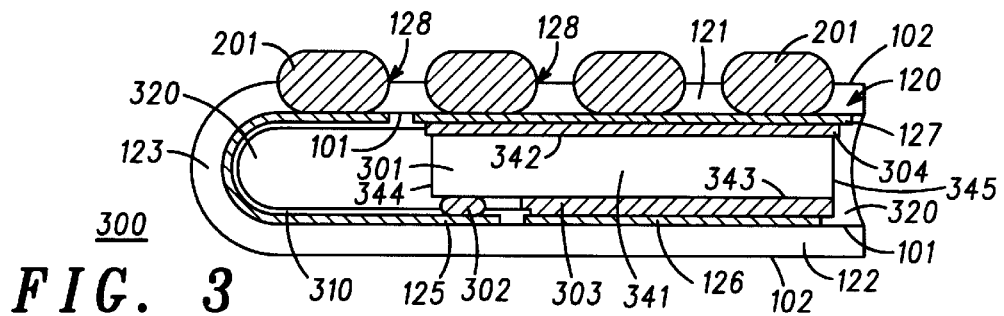
FIG. 3 illustrates a cross-sectional view of an embodiment of a semiconductor component taken along a section line 3—3 in FIG. 2 in accordance with the present invention.

FIG. 3 illustrates a cross-sectional view of a semiconductor component 300 taken along a section line 3—3 in FIG 2. Component 300 includes, among other things, substrate 120 with opposite surfaces 101 and 102, traces 125, 126, and 127 adjacent to surface 101, and electrical interconnect structures 201 in vias 128 and extending beyond surface 102 of substrate 120. Component 300 also includes a semiconductor substrate or chip 341 having opposite major surfaces 342 and 343 and opposite side or edge surfaces 344 and 345 coupling together surfaces 342 and 343. Chip 341 is illustrated in simplified block form and, in addition to a semiconductor substrate, can include appropriate metal and dielectric layers.

A semiconductor device 301 is located in and supported by chip 341. Device 301 can be a transistor, an integrated circuit, or the like. In the preferred embodiment, device 301 is a transistor having a gate electrode and a source electrode located at surface 343 and a drain electrode located at surface 342. An electrically conductive material such as, for example, conductive epoxy or solder 302, 303, and 304 can couple the gate, source, and drain electrodes to traces 125, 126, and 127, respectively. Preferably, traces 125, 126, and 127 remain electrically isolated from each other for proper operation of device 301.

Substrate 120 is folded, bent, or wrapped around chip 341 Such that surface 101 of substrate 120 faces towards surfaces 342, 343, and 344 of chip 341 while surface 102 of substrate 120 faces away from surfaces 342, 343, and 344 of chip 341. More specifically, middle portion 123 of surface 101 faces towards surface 344; end 121 of surface 101 faces towards surface 342; and end 122 of surface 101 faces towards surface 343. Furthermore, subtrate 120 is configured such that trace 125, the via 128 overlying trace 125, and the interconnect structure 201 that overlies trace 125 are absent over and do not directly overlie surface 342 of chip 341.

In the preferred embodiment, component 300 also includes an electrically insulative layer such as, for example, a coverlay or solder mask 310 overlying trace 125 and middle portion 123 of substrate 120. Mask 310 prevents trace 125 from directly contacting chip 341 in order to ensure that trace 125 does not improperly electrically bias device 301. Mask 310 can be comprised of conventional masking materials and is preferably disposed onto trace 125 before the bending or folding of substrate 120.

In the preferred embodiment, component 300 may further include an encapsulant 320. Encapsulant 320, if needed, is located between mask 310 and edge surface 344 of chip 341 and is also located at the other end of chip 341 to cover edge surface 345, which is not covered by substrate 120. As an example, encapsulant 320 can be comprised of glob top or underfill materials commonly used in electronic applications.

Figure 4:
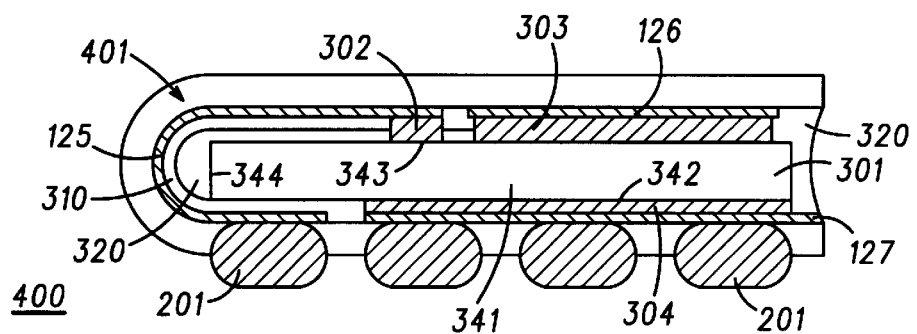
FIGS. 4 and 5 illustrate cross-sectional views of alternative embodiments of the semiconductor component of FIG. 3 in accordance with the present invention.

FIG. 4 illustrates a cross-sectional view of a semiconductor component 400, which is an alternative embodiment of component 300 of FIG. 3. Component 400 includes a substrate 401, which is similar to substrate 120 of FIG. 3, except that substrate 401 is smaller than substrate 120. Furthermore, all of interconnect structures 201 underlie chip 341 in component 400 while all of structures 201 do not overlie chip 341 in component 300 of FIG. 3.

Another difference between components 300 and 400 is that a single continuous trace 125 of component 400 in FIG. 4 is adjacent to surfaces 342 and 343 of chip 341 while trace 125 of component 300 in FIG. 3 is only adjacent to surface 343 of chip 341. The use of mask 310 is more important in component 400 than in component 300 because trace 125 is more likely to contact the corners or other surfaces of chip 341 and improperly electrically bias device 301 in component 400. In component 400, the portion of mask 310 that underlies chip 341 and that overlies interconnect structure 201 electrically isolates surface 342 of chip 341 from trace 125 such that trace 125 is only electrically coupled to device 301 at surface 343 of chip 341.

Figure 5:
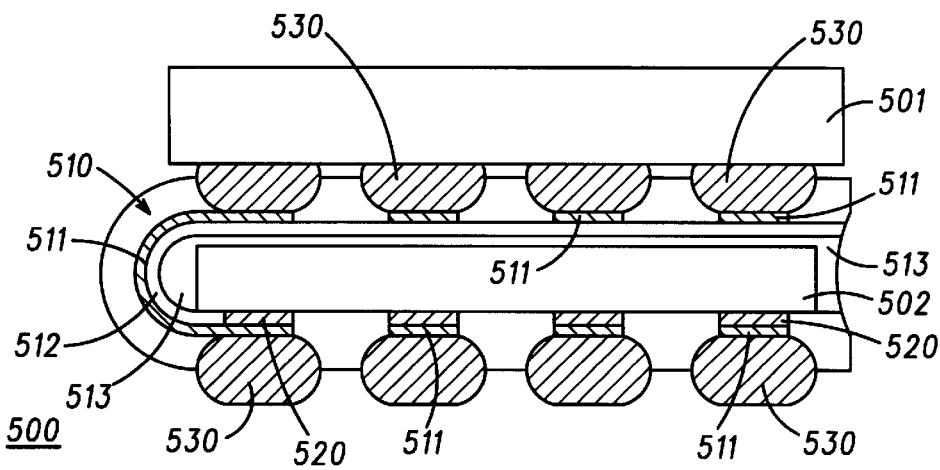

FIG. 5 illustrates a cross-sectional view of a semiconductor component 500, which is another alternative embodiment of component 300 of FIG. 3. Component 500 illustrates a multi-chip module. In particular, component 500 includes semiconductor substrates or chips 501 and 502, which can both be similar to chip 341 of FIG. 3. Component 500 also includes a substrate 510, traces 511, a mask 512, an encapsulant 513, solder 520, and electrical interconnect structures 530, which can be similar to substrate 120, traces 125, 126, and 127, mask 310, encapsulant 320, solder 302, 303, and 304, and structures 201 of FIG. 3. Traces 511 and structures 530 electrically couple together chips 501 and 502. As an example, chip 501 can be packaged as illustrated in either of FIGS. 3 or 4.

Figure 6:
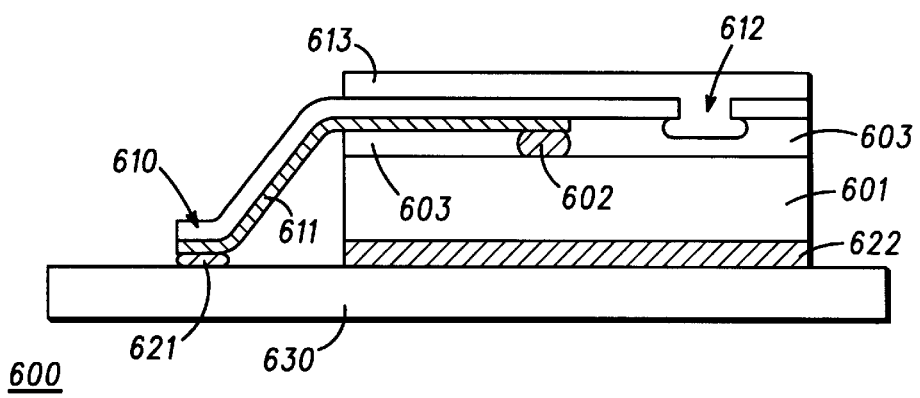
FIG. 6 illustrates a cross-sectional view of an embodiment of another semiconductor component in accordance with the present invention.

FIG. 6 illustrates a cross-sectional view of a semiconductor component 600. Component 600 may or may not be mounted on a rigid or flex circuit board 630. Component 600 includes a chip 601, solder portions 602, 621, and 622, substrate 610, and trace 611, which can be similar to chip 341 solder 302, 303, and 304, substrate 120, and traces 125, 126, and 127 of FIG. 3. An electrically insulative encapsulant 603 can be used to couple substrate 610 to chip 601. As an example, encapsulant 603 can be similar to encapsulant 320 of FIG. 3.

Substrate 610 covers the entire top surface of chip 601 to protect chip 601. Substrate 610 extends beyond chip 601 in a first direction. Trace 611 also extends beyond chip 601 in the same direction and electrically couples the top surface of chip 601 to board 630. Substrate 610 overlies trace 611 and can be absent underneath trace 611. Substrate 610 and trace 611 form a flexible circuit layer or interconnect structure.

Component 600 also may include a heatsink 613 located on an opposite surface of substrate 610 from trace 611. Heatsink 613 extends through a via 612 in substrate 610 such that heatsink 613 is closer to chip 601 and dissipates heat from chip 601 more efficiently. As an example, heatsink 613 can be comprised of the same material as trace 611. Heatsink 613 does not have to extend completely through via 612, and via 612 does not have to extend completely through substrate 610. Furthermore, heatsink 613 can optionally extend through a plurality of vias in substrate 610.

Figure 7:
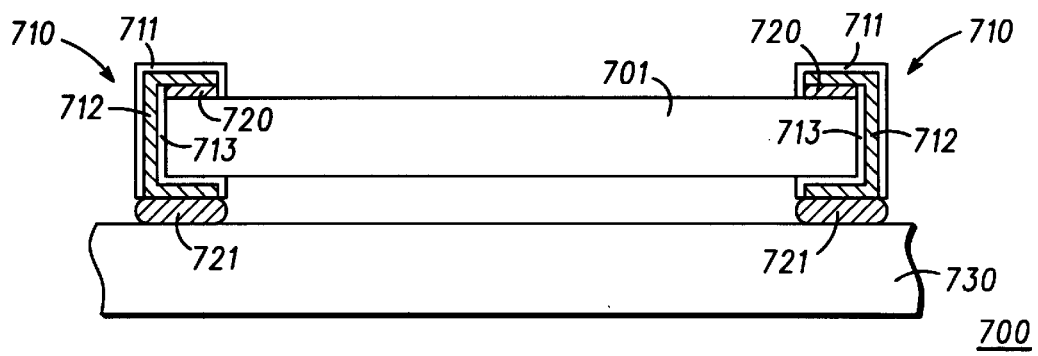
FIGS. 7, 8, and 9 illustrate cross-sectional views of alternative embodiments of the semiconductor component of FIG. 6 in accordance with the present invention.

FIG. 7 illustrates a cross-sectional view of a semiconductor component 700, which is an alternative embodiment of semiconductor component 600 of FIG. 6. Component 700 includes a semiconductor substrate or chip 701, which preferably contains an integrated circuit, and flexible circuit layers or substrates 710, which can be similar to substrate 610 of FIG. 6. Substrates 710 are bend around the side or edge surfaces of chip 701. Substrates 710 protect chip 701 and electrically couple chip 701 to a circuit board 730. Chip 701 has bonding pads at its top surface. Depending upon the location of the bonding pads across the top surface of chip 701, substrates 710 can be applied to all side surfaces of chip 701, instead of only two opposite side surfaces of chip 701. Although substrates 710 are illustrated as two separate pieces, component 700 can be manufactured using a single flexible circuit layer that covers the entire top surface of chip 701. Alternatively, a thin coating of a protective material such as, for example, silicone, can be sprayed on the top surface of chip 701 to improve reliability test performance.

Substrates 710 include an electrically insulative outer layer 711, electrically conductive traces 712, and electrically insulative masking layers 713. Substrates 710 are physically and electrically coupled to chip 701 by solder 720. Substrates 710 are physically coupled to chip 701 by an adhesive or an encapsulant on masking layers 713. Substrates 710 are physically and electrically coupled to board 730 by solder 721. The flexible nature of substrates 710 improves the reliability of component 700 by reducing the external stresses to the chip 701 caused by mounting component 700 to board 730.

Figure 8:
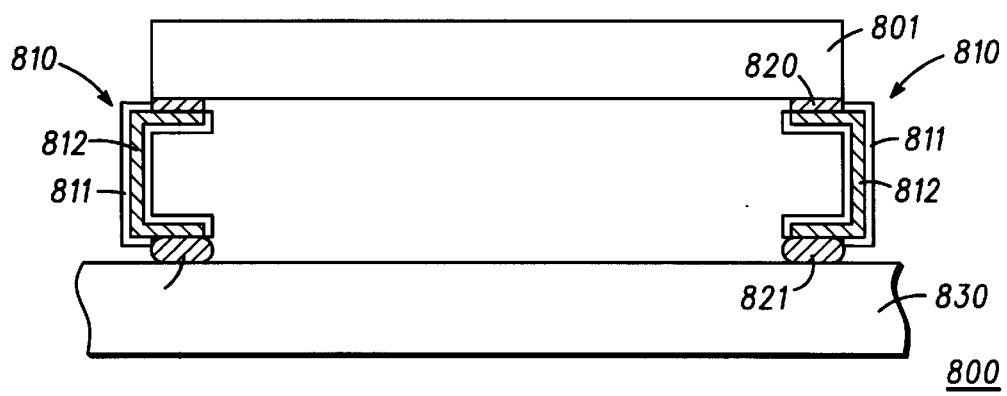

FIG. 8 illustrates a cross-sectional view of a semiconductor component 800, which is an alternative embodiment of semiconductor component 600 of FIG. 6. Component 800 includes a semiconductor substrate or chip 801 and flexible circuit layers or substrates 810, which are similar to chip 701 of FIG. 7 and substrate 610 of FIG. 6, respectively. Substrates 810 electrically couple chip 801 to a circuit board 830. Chip 801 has bonding pads at its bottom surface. Depending upon the location of the bonding pads across the bottom surface of chip 801, substrates 810 can be located around the entire perimeter of chip 801, instead of only at two opposite sides of chip 801. Although substrates 810 are illustrated as two separate pieces, component 800 can be manufactured using a single flexible circuit layer that covers the entire bottom surface of chip 801.

Substrates 810 includes an electrically insulative outer layer 811 and electrically conductive traces 812. As illustrated in FIG. 8, traces 812 can optionally be sandwiched between two insulative layers. Substrates 810 are physically and electrically coupled to chip 801. Solder 820 electrically couples chip 801 to substrates 810, and solder 821 electrically couples substrates 810 to board 830. The flexible nature of substrates 810 improves the reliability of component 800 by isolating chip 801 from external stresses caused by mounting component 800 to board 830. Since the bonding pads on the chip 801 face down towards board 830 and are not exposed, this method of assembly naturally improves protection to the bonding pads and the solder contact 821 of the bonding pads with the electrically conductive traces 812.

Figure 9:
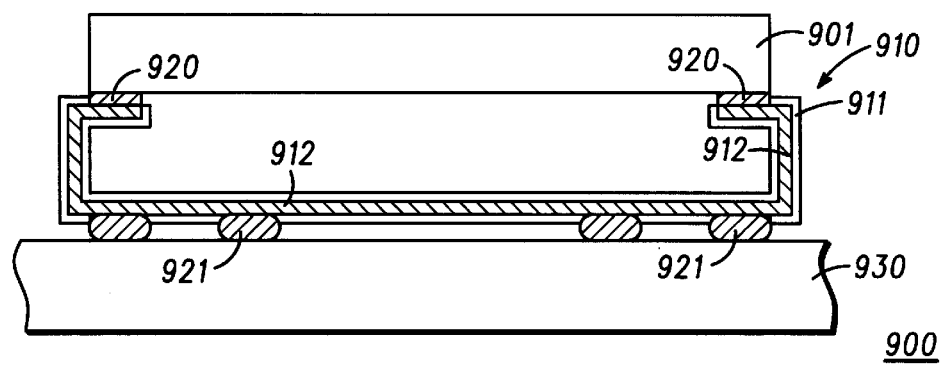

FIG. 9 illustrates a cross-sectional view of a semiconductor component 900, which is an alternative embodiment of semiconductor component 800 of FIG. 8. Component 900 includes a semiconductor substrate or chip 901 and a flexible circuit layer or substrate 910, which are similar to chip 701 of FIG. 7 and substrate 810 of FIG. 8, respectively. Substrate 910 electrically couples chip 901 to a circuit board 930. Chip 901 has bonding pads at its bottom surface. Depending upon the location of the bonding pads across the bottom surface of chip 901, substrates 910 can be located around the entire perimeter of chip 901, instead of only at opposite sides of chip 901. Substrate 910 can optionally be continuous across the bottom surface of chip 901.

Substrate 910 includes an electrically insulative outer layer 911 and electrically conductive traces 912. As illustrated in FIG. 9, traces 912 can optionally be sandwiched between two insulative layers. Substrate 910 is physically and electrically coupled to chip 901. Solder 920 electrically couples chip 901 to substrate 910, and solder 921 electrically couples substrate 910 to board 930. The flexible nature of substrate 910 improves the reliability of component 900 by isolating chip 901 from external stresses caused by mounting component 900 to board 930. Since the bonding pads on the chip 901 face down towards board 930 and are not exposed, this method of assembly naturally improves protection to the bonding pads and solder 921 of the bonding pads with the electrically conductive traces 912. Furthermore, by distributing solder 921 across a larger area of board 930, this configuration provides better distribution of stress compared to component 800 of FIG. 8.

Figure 10:
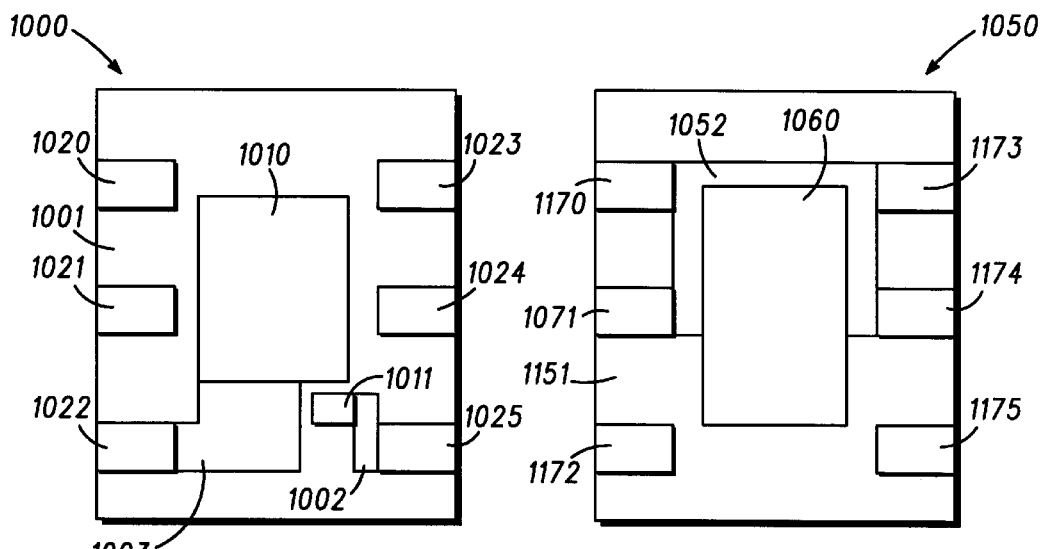
FIG. 10 illustrates a top view of an embodiment of additional packaging substrates in accordance with the present invention.

FIG. 10 illustrates a top view of flexible circuit layers or packaging substrates 1000 and 1050. Substrates 1000 and 1050 can be similar to substrate 120 of FIG. 1.

Substrate 1000 comprises a flexible electrically insulative layer 1001, electrically conductive traces 1002 and 1003, and solder portions 1010, 1011, 1020, 1021, 1022, 1023, 1024, and 1025. Portions 1020, 1021, 1022, 1023, 1024, and 1025 are located over a perimeter portion of layer 1001. Portions 1010 and 1011 are located over a central region of layer 1001 and over traces 1003 and 1002. In the preferred embodiment, solder portions 1010 and 1011 are aligned to source and gate electrodes, respectively, of a discrete semiconductor transistor.

Substrate 1050 comprises a flexible electrically insulative layer 1051, electrically conductive trace 1052, and solder portions 1060, 1070, 1071, 1072, 1073, 1074, and 1075.

Portion 1070, 1071, 1072, 1073, 1074, and 1075 are located over a perimeter portion of layer 1051. Portion 1060 is located over a central region of layer 1051 and over trace 1052. In the preferred embodiment, solder portion 1060 is aligned to a drain electrode of a transistor.

Figure 11:
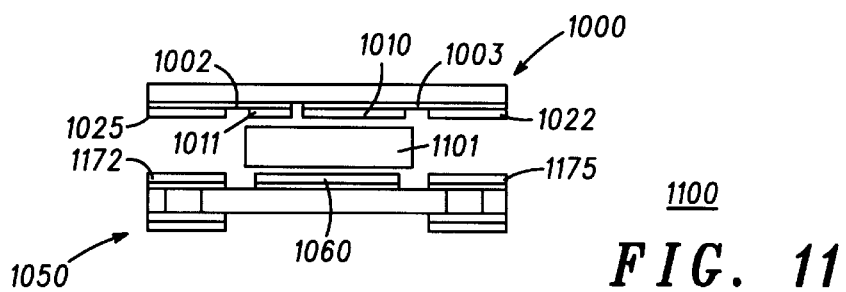
FIG. 11 illustrates a side view of an embodiment of a semiconductor component during manufacturing wherein the semiconductor component is comprised of the additional packaging substrates.

FIG. 11 illustrates a side view of a semiconductor component 1100 during manufacturing. Component 1100 comprises substrates 1000 and 1050 and a semiconductor substrate or chip 1101 supporting a semiconductor device such as, for example, a transistor. Chip 1101 is packaged by being laminated between substrates 1000 and 1050. The packaging of chip 1101 electrically couples the electrically conductive traces of substrates 1000 and 1050 to chip 1101. An electrically insulative adhesive, epoxy, or encapsulant can also be used to adhere substrates 1000 and 1050 to chip 1101.

Figure 12:
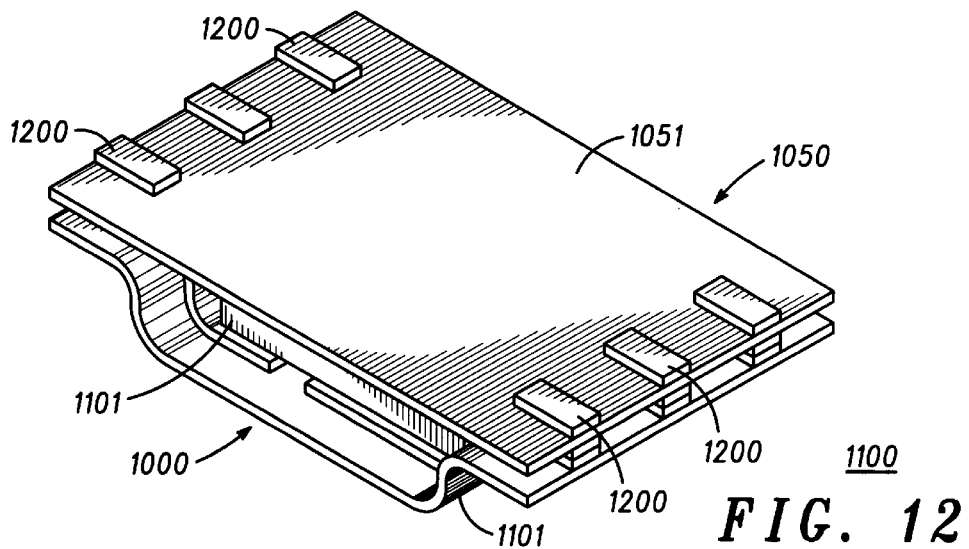
FIG. 12 illustrates a perspective view of the semiconductor component of FIG. 11 after subsequent manufacturing.

FIG. 12 illustrates a perspective view of semiconductor component 1100 after subsequent manufacturing. Substrate 1050 faces towards the bottom surface of chip 1101; a portion of substrate 1000 faces towards the side surface of chip 1101; and a different portion of substrate 1000 faces towards the top surface of chip 1101. Two opposite side surfaces of chip 1101 remain exposed after the laminating step. A glob top material or other encapsulant can be used to cover the two exposed side surfaces of chip 1101.

The perimeter solder portions of substrates 1000 and 1050 are aligned together during the laminating step. Substrate 1050 includes vias beneath the perimeter solder portions, and other interconnect structures 1200 fill the vias and protrude from the vias to electrically couple component 1100 to a circuit board. As an example, structures 1200 can also be comprised of solder.

Component 1100 could include a heatsink coupled to substrate 1000. The optional heatsink can be similar to heatsink 613 of FIG. 6. Furthermore, component 1100 could be manufactured with a single flexible circuit layer by combing the concepts described in FIGS. 1 through 5 with the concepts described in FIGS. 10, 11, and 12.

Figure 13:
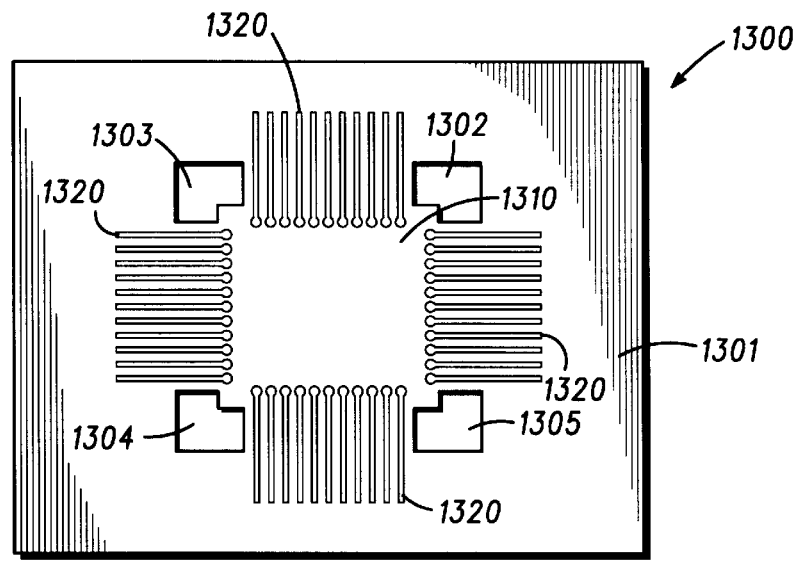
FIG. 13 illustrates a top view of an alternative embodiment of the additional packaging substrates of FIG. 10.

FIG. 13 illustrates a top view of a flexible circuit layer or packaging substrate 1300, which is an alternative embodiment of substrate 1000 of FIG. 10. Substrate 1300 comprises an electrically insulative layer 1301 and electrically conductive traces 1320. Layer 1301 includes vias or holes 1302, 1303, 1304, and 1305. A central portion 1310 of layer 1301 is partially delineated by holes 1302, 1303, 1304, and 1305.

Figure 14:
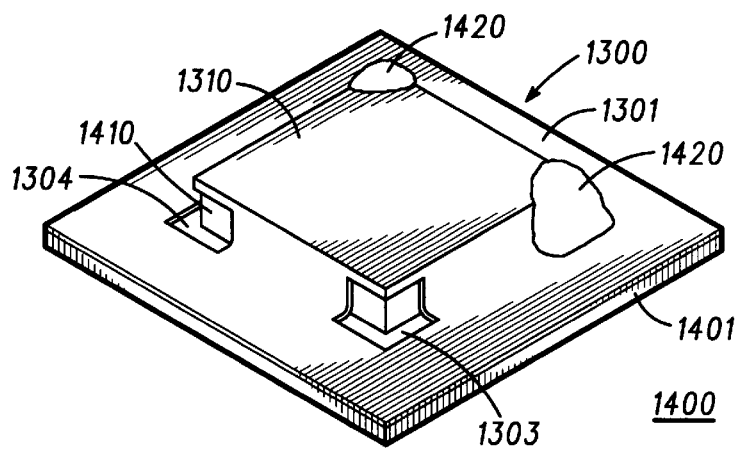
FIG. 14 illustrates a perspective view of an alternative embodiment of the semiconductor component of FIG. 12 that uses the additional packaging substrate of FIG. 13.

FIG. 14 illustrates a perspective view of a semiconductor component 1400, which is an alternative embodiment of semiconductor component 1100 of FIG. 12. Component 1400 includes a semiconductor substrate or chip 1410, substrate 1300, and another flexible circuit layer or packaging substrate 1401. Central portion 1310 of substrate 1300 overlies and is physically coupled, affixed, or attached to a top surface of chip 1410. Substrate 1300 is also preferably physically coupled, affixed, or attached to the side surfaces of chip 1410. Substrate 1300 is coupled to substrate 1401 around an entire perimeter of chip 1410, which is different from component 1100 in FIG. 12.

Holes 1302, 1303, 1304, and 1305 are aligned to and expose the corners of chip 1410. Interfaces between adjacent side surfaces of chip 1410 form the corners of chip 1410. An encapsulant 1420 can cover holes 1302, 1303, 1304, and 1305 to protect the exposed corners of chip 1410.

Substrate 1401 can be similar to substrate 1050 of FIG. 12 in that substrate 1401 can have through-hole vias. Traces 1320 (FIG. 13) of substrate 1300 can be electrically coupled to bonding pads located at the top surface of chip 1410. Traces 1320 can also be electrically coupled to the through-hole vias, which can be electrically coupled to a circuit board at the bottom side of substrate 1401. In this embodiment, substrate 1401 is similar to a ball grid array substrate or a pin grid array substrate.

In an alternative embodiment, component 1400 can be manufactured with a single flexible circuit layer by combining the concepts described in FIGS. 1 through 5 with the concepts described in FIGS. 13 and 14.

Figure 15:
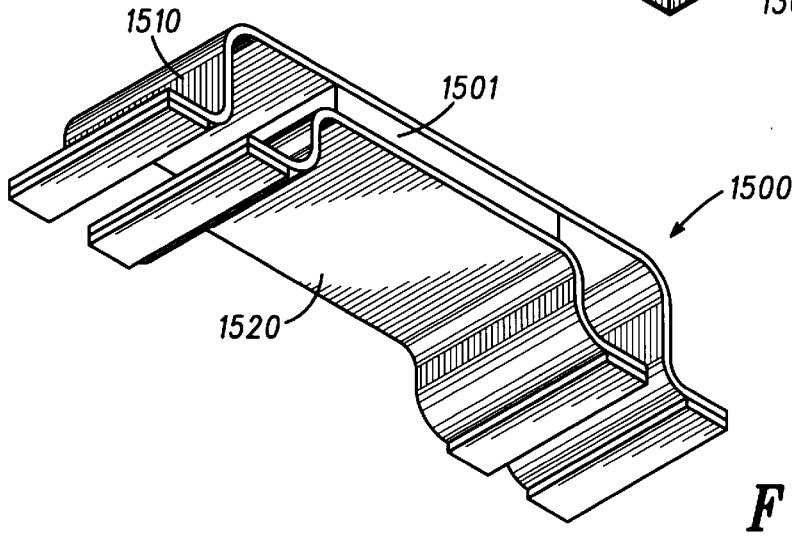
FIG. 15 illustrates a perspective view of another alternative embodiment of the semiconductor component of FIG. 6.

FIG. 15 illustrates a perspective view of a semiconductor component 1500, which is an alternative embodiment of semiconductor component 600 of FIG. 6. Component 1500 includes a semiconductor substrate or chip 1501 and flexible circuit layers or packaging substrates 1510 and 1520. Substrate 1510 is physically coupled, affixed, or attached to and covers the entire top surface of chip 1501. Substrate 1520 covers the entire bottom surface of chip 1501. In the preferred embodiment, chip 1501 is electrically coupled to both of substrates 1510 and 1520, which are mounted onto a circuit board, but substrates 1510 and 1520 are not electrically connected with each other. The flexible nature of substrates 1510 and 1520 isolates chip 1501 from external stresses caused by mounting component 1500 to the circuit board. The larger contact pads of component 1500 help improve heat dissipation from chip 1501 to a circuit board.

Therefore, an improved semiconductor component and method of manufacture is provided to overcome the disadvantages of the prior art. The semiconductor component described herein has a lower manufacturing cost by using a flexible polyimide substrate with metal traces, by eliminating expensive metal leadframes, and by avoiding metal leadframe waste. The manufacturing cost is also lowered by using a lesser amount of encapsulant and by eliminating encapsulant waste by using glob top or some other non-injection and non-transfer molded encapsulant. The manufacturing cost is further lowered by increasing throughput via fast gang testing where a plurality of packaged components can be simultaneously electrically tested before being singulated from the tape or ribbon. These manufacturing processes are less capital equipment intensive, and do not require expensive tooling involved with conventional injection or transfer molding processes. The process is more amenable to changing die sizes compared to conventional molding processes. Furthermore, the manufacturing process is also simplified because conventional leadframe trimming, lead bending, and lead planarization steps are eliminated.

Additional improvements include a smaller packaged semiconductor component by using the thin flexible substrate instead of a metal leadframe and a bulky transfer molded encapsulant. In the preferred embodiment, a ratio between the size of the packaged component and the size of the unpackaged chip is preferably approximately 1:1.2 or less, which is true chip size packaging. Package heights are also reduced significantly, aiding the use of these packages in portable applications. The thermal dissipation characteristics of the semiconductor component are also improved because the smaller or thinner packaged components involve direct exposure of the semiconductor chips to ambient air in some embodiments. Additionally, the resistance to radiation of the packaged component is also improved because the polyimide material provides protection from ultraviolet and alpha radiation. Furthermore, the reliability of the semiconductor components is improved because the interconnect structures are supported by the flexible polyimide substrate. Moreover, the electrical performance of the semiconductor component is improved by reducing the interconnect length to lower the parasitic impedance and on-resistance of the component. By using more flexible electrical leads, the resulting semiconductor component can be isolated from external stresses associated with mounting the component onto a circuit board.

While the invention has been particularly shown and described mainly with reference to preferred embodiments, it will be understood by those skilled in the art that changes in form and detail may be made without departing from the spirit and scope of the invention. For instance, the numerous details set forth herein such as, for example, the material compositions and thicknesses are provided to facilitate the understanding of the present invention and are not provided to limit the scope of the invention. As another example, heatsink 613 of FIG. 6 can be used on end 122 of component 300 of FIG. 3 or on component 400 of FIG. 4. Moreover, encapsulant 320 can be eliminated from component 400 if device 301 does not extend to the edges of chip 341. Encapsulant 320 of component 300 should not be eliminated to ensure that the interconnect structure 201 that does not overlie chip 341 has adequate support.

Additional alternatives include modifying component 600 in FIG. 6 such that heatsink 613 is replaced with an additional chip. This alternative can be further modified by lengthening the right end of substrate 610 to fold over the top surface of the additional chip. As another alternative, chip 501 in FIG. 5 can be replaced with a plurality of passive components including, for example, discrete resistors, capacitors, and inductors. Furthermore, substrates 120, 401, and 510 can be wrapped, folded, or bent around all the edge surfaces of the semiconductor chips. It is also possible to stack multiple die in components 700, 800, and 900 similar to component 500 of FIG. 5.

Accordingly, the disclosure of the present invention is not intended to be limiting. Instead, the disclosure of the present invention is intended to be illustrative of the scope of the invention, which is set forth in the following claims.

What is claimed is:

1. A semiconductor component comprising:
   a substrate having first and second surfaces opposite each other and having a side surface coupling the first and second surfaces together;
   a semiconductor device disposed in the substrate;
   a flexible circuit layer covering the first, second and side surfaces of the substrate, the flexible circuit layer having an electrically insulative layer covering an electrically conductive layer electrically coupled to the semiconductor device, the electrically conductive layer located between the substrate and the electrically insulative layer; and
   wherein the flexible circuit layer is electrically coupled to the semiconductor device at the first and second surfaces of the substrate.

2. The semiconductor component of claim 1 wherein a single continuous portion of the flexible circuit layer covers and is affixed to the first, second, and side surfaces of the substrate, and wherein a ratio between a size of the substrate and a size of the flexible circuit layer and the substrate is approximately 1:1.2 or less.

3. The semiconductor component of claim 1 further comprising:
   an additional substrate overlying the substrate wherein the flexible circuit layer is located between the additional substrate and the substrate; and
   an additional semiconductor device in the additional substrate wherein the electrically conductive layer electrically couples the additional semiconductor device and the semiconductor device together.

4. The semiconductor component of claim 1 further comprising an additional electrically insulating layer covering portions of the electrically conductive layer, located between the electrically conductive layer and the substrate, underlying the first surface of the substrate, adjacent to the side surface of the substrate, and absent over the second surface of the substrate.

5. The semiconductor component of claim 1 further comprising an additional electrically insulating layer covering portions of the electrically conductive layer, located between the electrically conductive layer and the substrate, underlying the first surface of the substrate, adjacent to the side surface of the substrate, and located over the second surface of the substrate.

6. The semiconductor component of claim 1 wherein the substrate has an additional side surface coupling the first and second surfaces together and opposite the side surface and wherein the flexible circuit layer is devoid of covering the additional side surface.

7. The semiconductor component of claim 6 wherein an encapsulant covers the additional side surface of the substrate.

8. The semiconductor component of claim 1 wherein the electrically insulative layer has vias extending through a portion of the electrically insulative layer to expose portions of the electrically conductive layer.

9. The semiconductor component of claim 8 wherein the vias only overlie a portion of the electrically conductive layer that overlies the substrate.

10. The semiconductor component of claim 1 wherein the substrate further comprises a first side surface opposite the side surface, a second side surface coupling together the first side surface and the side surface, and a third side surface opposite the second side surface, wherein the flexible circuit layer is affixed to and covers the first side surface, and wherein the second and third side surfaces remain exposed.

11. The semiconductor component of claim 1 wherein the substrate comprises corners, a first side surface opposite the side surface, a second side surface coupling together the first side surface and the side surface, and a third side surface opposite the second side surface, wherein the flexible circuit layer covers the first, second, and third side surfaces, and wherein the flexible circuit layer has holes exposing the corners of the substrate.

12. The semiconductor component of claim 11 further comprising an encapsulant covering the holes of the flexible circuit layer.

13. A semiconductor component comprising:
   a substrate having first and second surfaces opposite each other and having an edge surface coupling the first and second surfaces together;
   a semiconductor device disposed in the substrate;
   a flexible polyimide layer having first and second surfaces opposite each other and having first and second ends opposite each other and having a middle portion coupling the first and second ends, wherein the first end of the first surface faces towards the first surface of the substrate, wherein the second end of the first surface faces towards the second surface of the substrate, and wherein the middle portion of the first surface faces towards the edge surface of the substrate;
   copper traces on the first surface of the flexible polyimide layer wherein a first portion of the copper traces overlies the first end of the first surface of the flexible polyimide layer and wherein a second portion of the copper traces overlies the first end, the second end, and the middle portion of the first surface of the flexible polyimide layer;

a first solder portion electrically coupling the first portion of the copper traces to the semiconductor device at the first surface of the substrate; and a second solder portion electrically coupling the second portion of the copper traces to the semiconductor device at the second surface of the substrate.

14. The semiconductor component of claim 13 wherein the first and second portions of the copper traces are electrically isolated from each other.

15. The semiconductor component of claim 13 further comprising a solder mask over a portion of the second portion of the copper traces that overlies the middle portion of the flexible polyimide layer.

16. The semiconductor component of claim 15 further comprising an encapsulant between the edge surface and the solder mask.

17. The semiconductor component of claim 13 wherein the flexible polyimide layer has vias at the first end extending from the first surface to the second surface, wherein the first and second portions of the copper traces cover the vias along the first surface of the flexible polyimide layer, and further comprising solder bumps in the vias and electrically coupled to the first and second portions of the copper traces wherein the solder bumps extend out of the vias and beyond the second surface of the flexible polyimide layer.

18. The semiconductor component of claim 17 wherein the vias covered by the second portion of the copper traces overlies the substrate.

19. The semiconductor component of claim 17 wherein the vias covered by the second portion of the copper traces are absent over the substrate.

20. The semiconductor component of claim 13 wherein the semiconductor device is a transistor comprising:

a gate electrode at the second surface of the substrate and electrically coupled to a portion of the second portion of the copper traces by a portion of the second solder portion;

a source electrode at the second surface of the substrate and electrically coupled to a different portion of the second portion of the copper traces by a different portion of the second solder portion wherein the portion and the different portion of the copper traces are electrically isolated from each other; and a drain electrode at the first surface of the substrate and electrically coupled to the first portion of the copper traces by the first solder portion.

21. The semiconductor component of claim 13 wherein the flexible polyimide layer includes at least one via at the second end of the flexible polyimide layer and further comprising a heatsink adjacent to the second surface of the flexible polyimide layer at the second end of the flexible polyimide layer wherein a portion of the heatsink extends into the at least one via.

22. A semiconductor component comprising:

a circuit board;

a substrate having first and second surfaces opposite each other, the second surface facing towards the circuit board;

a semiconductor device in the substrate, the semiconductor device electrically coupled to the circuit board at the second surface of the substrate;

a flexible electrically insulative layer covering the entire first surface of the substrate and extending beyond the first surface in a first direction; and an electrically conductive layer between the flexible electrically insulative layer and the substrate and electrically coupled to the semiconductor device at the first surface of the substrate, a portion of the electrically conductive layer extending beyond the first surface in the first direction, the flexible electrically insulative layer overlying the electrically conductive layer.

23. A semiconductor component comprising:

a circuit board;

a substrate, positioned over the circuit board, supporting a semiconductor device and having bonding pads at a first surface;

a flexible circuit layer physically and electrically coupled to the bonding pads and bent underneath the substrate so that a first portion of the flexible circuit layer is folded over substantially backwards and opposite from a second portion of the flexible circuit layer;

wherein the flexible circuit layer is electrically coupled to the circuit board; and wherein both the first and second portions of the flexible circuit layer are disposed between the substrate and the circuit board.

24. The semiconductor component of claim 23 wherein the flexible circuit layer has a continuous portion disposed adjacent to the circuit board and substantially coextensive with the substrate.

25. A semiconductor component comprising: a semiconductor substrate having first and second surfaces opposite each other;

a circuit board;

a flexible circuit layer, physically and electrically coupling the first surface of the substrate to the circuit board, for reducing external stress to the semiconductor substrate from the circuit board, wherein a portion of the flexible circuit layer is disposed between the semiconductor substrate and the circuit board;

wherein a first portion of the flexible circuit layer is folded over substantially backwards and opposite from a second portion of the flexible circuit layer; and wherein the first and second portions of the flexible circuit layer are disposed between the semiconductor substrate and the circuit board.

26. A semiconductor component comprising:

a substrate having first and second surfaces opposite each other;

a semiconductor device disposed in the substrate;

a first flexible circuit layer covering the first surface of the substrate, wherein the first flexible circuit layer is electrically coupled to the semiconductor device at the first surface of the substrate; and a second flexible circuit layer covering the second surface of the substrate, wherein the second flexible circuit layer is electrically coupled to the semiconductor device at the second surface of the substrate.

27. The semiconductor component of claim 26 wherein the first flexible circuit layer and the second flexible circuit layer together provide the initial packaging for the substrate.

28. The semiconductor component of claim 26 wherein the first flexible layer comprises first and second ends and is bent at both the first and second ends.

29. The semiconductor component of claim 1 wherein the flexible circuit layer provides the initial packaging for the substrate.

30. The semiconductor component of claim 13 wherein the flexible polyimide layer provides the initial packaging for the substrate.

* * * * *